United States Patent
Michna et al.

(10) Patent No.: US 11,644,879 B2
(45) Date of Patent: May 9, 2023

(54) POWER CONTROL SYSTEM FOR A MODULAR SERVER ENCLOSURE

(71) Applicant: HEWLETT PACKARD ENTERPRISE DEVELOPMENT LP, Houston, TX (US)

(72) Inventors: Vincent W. Michna, Houston, TX (US); Nilashis Dey, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/466,762

(22) Filed: Sep. 3, 2021

(65) Prior Publication Data
US 2023/0074993 A1    Mar. 9, 2023

(51) Int. Cl.
G06F 1/26    (2006.01)
G06F 1/18    (2006.01)
H05K 7/14    (2006.01)

(52) U.S. Cl.
CPC .............. *G06F 1/26* (2013.01); *G06F 1/181* (2013.01); *G06F 1/189* (2013.01); *H05K 7/1492* (2013.01)

(58) Field of Classification Search
None
See application file for complete search history.

(56) References Cited

U.S. PATENT DOCUMENTS

| | | | |
|---|---|---|---|
| 5,815,389 A * | 9/1998 | Plow | H02J 1/102 363/67 |
| 7,271,999 B2 | 9/2007 | Rabinovitz | |
| 7,494,064 B2 | 2/2009 | Slutsky et al. | |
| 9,337,688 B2 | 5/2016 | Englert et al. | |
| 9,658,665 B2 | 5/2017 | Chapel et al. | |
| 2004/0239188 A1 | 12/2004 | Bohl et al. | |
| 2006/0262464 A1 * | 11/2006 | Bernat | H02J 1/102 361/18 |
| 2007/0263178 A1 * | 11/2007 | Lee | G03B 21/2053 353/85 |
| 2008/0164855 A1 * | 7/2008 | Tam | G06F 1/263 323/233 |

(Continued)

FOREIGN PATENT DOCUMENTS

| WO | WO-2014134218 A1 | 9/2014 |
|---|---|---|
| WO | WO-2015148686 A1 | 10/2015 |

*Primary Examiner* — Danny Chan
(74) *Attorney, Agent, or Firm* — Hewlett Packard Enterprise Patent Department

(57) ABSTRACT

Example implementations relate to a power control system for controlling transmission of power from one or more power supply devices to one or more loads of a modular server enclosure. The power control system includes an electronic fuse and a threshold control unit. The electronic fuse is connected between one or more loads and the one or more power supply devices of the modular server enclosure. The threshold control unit is connected to the electronic fuse and to the one or more power supply devices. The threshold control circuit dynamically adjusts a threshold current for the electronic fuse based on a power supply capacity of the one or more power supply devices. The electronic fuse controls the transmission of the power from the one or more power supply devices to the one or more loads based on threshold current and a load current drawn by the one or more loads.

17 Claims, 5 Drawing Sheets

(56) References Cited

U.S. PATENT DOCUMENTS

| | | | |
|---|---|---|---|
| 2012/0026667 A1* | 2/2012 | Atluri | G06F 1/26 |
| | | | 361/679.31 |
| 2015/0077079 A1* | 3/2015 | Ejury | H02M 3/1584 |
| | | | 323/282 |
| 2018/0069395 A1* | 3/2018 | Morii | G06F 1/263 |
| 2018/0175730 A1* | 6/2018 | Leong | H02M 3/158 |
| 2019/0006839 A1* | 1/2019 | Humphrey | G01R 27/2605 |
| 2019/0260224 A1* | 8/2019 | Lai | H02J 9/061 |
| 2020/0081514 A1 | 3/2020 | Brown et al. | |
| 2020/0185911 A1* | 6/2020 | Bernat | H03K 17/0822 |
| 2020/0249738 A1 | 8/2020 | Rhinehart et al. | |
| 2020/0293419 A1 | 9/2020 | Messick et al. | |
| 2022/0123556 A1* | 4/2022 | Demissie | H02J 3/16 |

\* cited by examiner

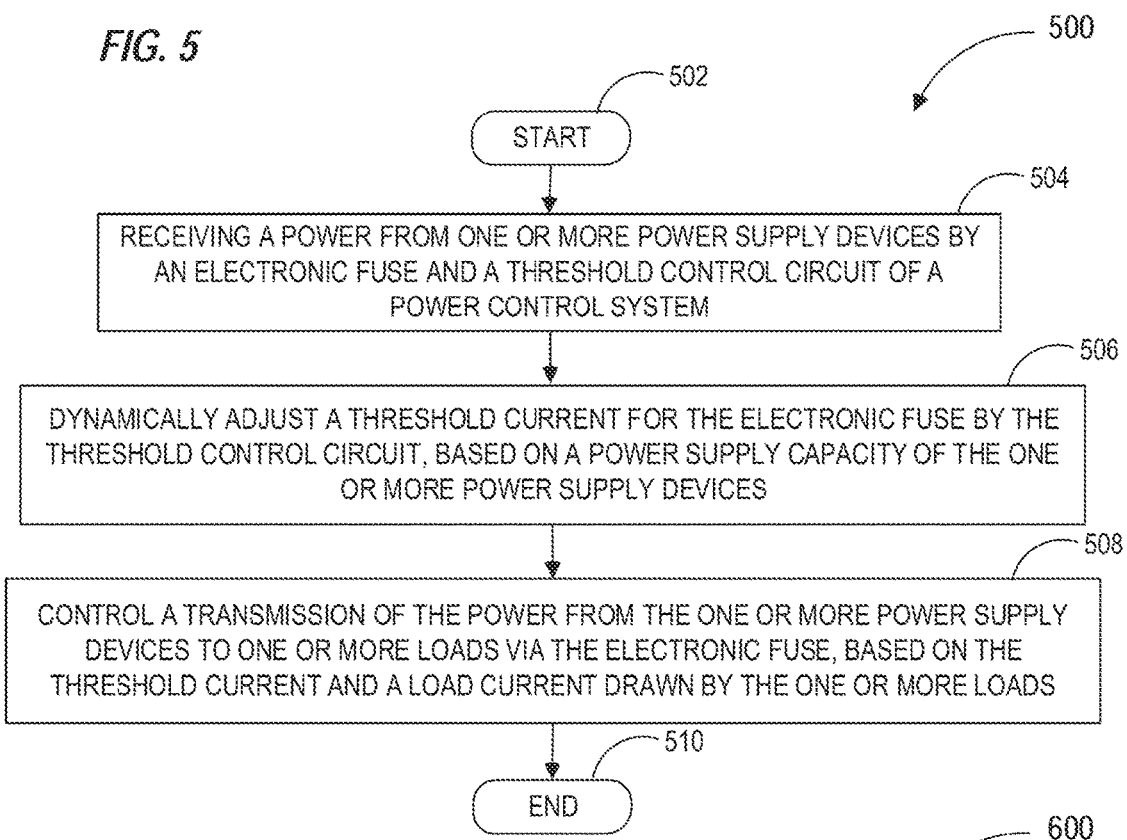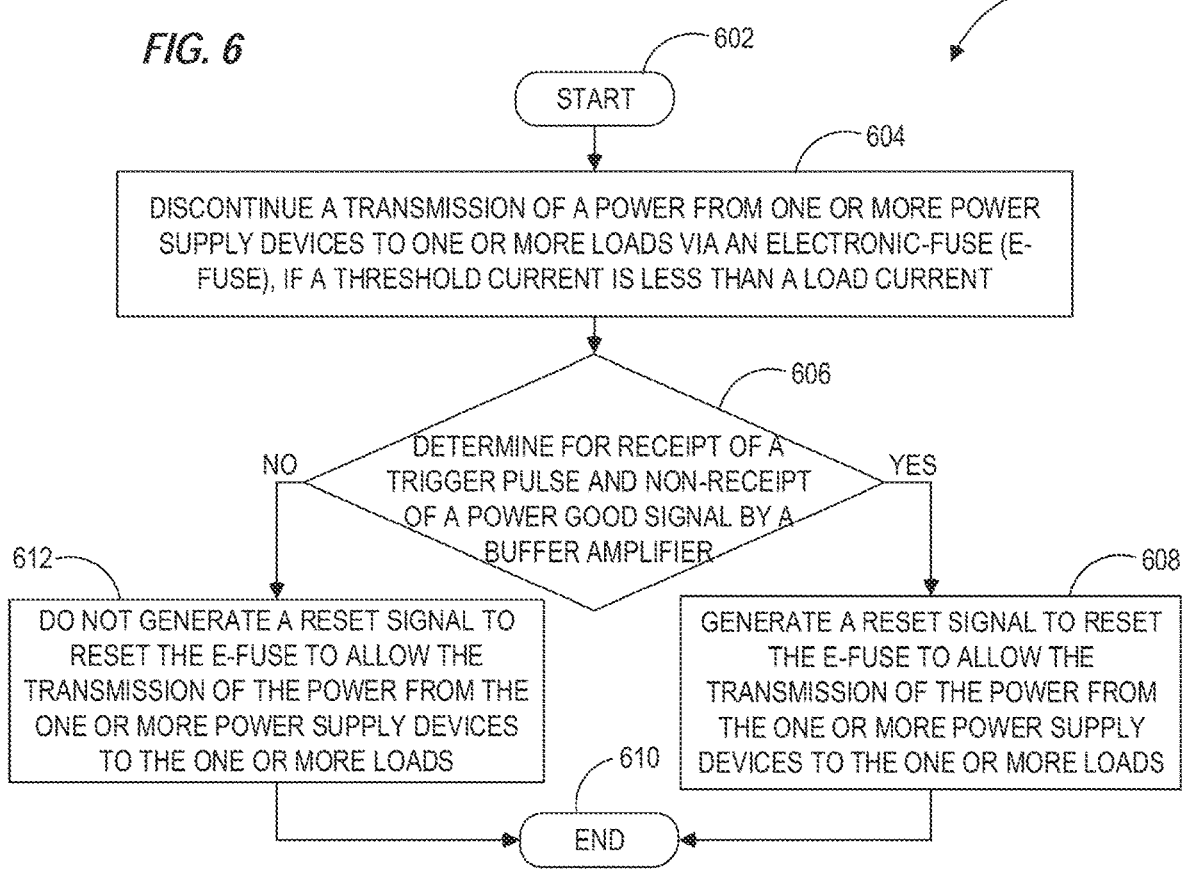

POWER CONTROL SYSTEM FOR A MODULAR SERVER ENCLOSURE

BACKGROUND

A server enclosure may house multiple electronic components, such as main electronic components and auxiliary electronic components. For example, the main electronic components may include processors, memory devices, network switches, or the like. Whereas the auxiliary electronic components may include fans, liquid cooling devices, controllers, or the like. Additionally, the server enclosure may include one or more power supply devices, such as main power supply devices connected to the main electronic components, and an auxiliary power supply device connected to the auxiliary electronic components. The one or more power supply devices may directly supply power to the main and auxiliary electronic components to allow them to perform their intended functions.

BRIEF DESCRIPTION OF THE DRAWINGS

Various examples will be described below with reference to the following figures.

FIG. 5 is a flowchart depicting a method of controlling power supply from one or more power supply devices to one or more loads using a power control system according to an example implementation of the present disclosure.

FIG. 6 is a flowchart depicting a method of automatically resetting an electronic fuse to allow a transmission of a power from one or more power supply devices to one or more loads according to an example implementation of the present disclosure.

DETAILED DESCRIPTION

Figure 1:
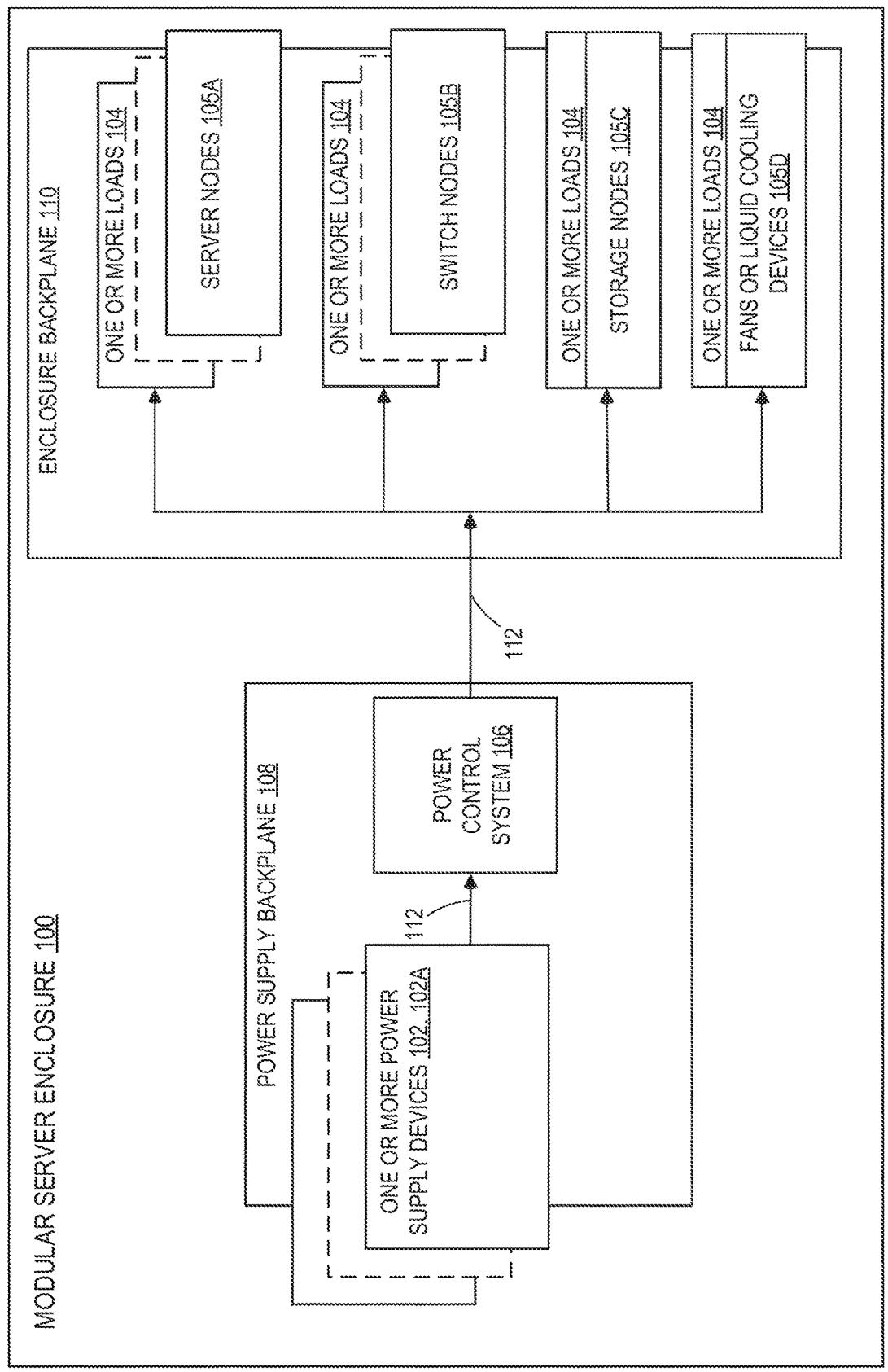
FIG. 1 is a block diagram depicting a modular server enclosure according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, and the term "including" means including but not limited to. The term "based on" means based at least in part on.

As used herein, the term "dynamic" may refer to a constant change (automatically) in a monitored value (i.e., threshold current of an electronic fuse) that is initiated by addition of a new load or a removal of a power supply device. As used herein, the term "load" may refer to an electronic load or an electric load of a modular server enclosure. The term "modular" may refer to a flexible nature of a server enclosure, which allows discrete modules of the server enclosure to be added into or removed from the server enclosure at any instance to meet the customer's business requirement. The term "threshold current" may refer to a maximum transmission current that an electronic fuse may allow to supply from the power supply device to the load. The term "load current" may refer to a maximum current drawn by the one or more loads to perform their intended functions. The term "power supply capacity" may refer to a cumulative current supply capacity of the modular sever enclosure to meet the power demand from the one or more loads.

For purposes of explanation, certain examples are described with reference to the components illustrated in FIGS. 1-6. The functionality of the illustrated components may overlap, however, and may be present in a fewer or greater number of elements and components. Further, all or part of the functionality of the illustrated elements may co-exist or be distributed among several geographically dispersed locations. Moreover, the disclosed examples may be implemented in various environments and are not limited to the illustrated examples. Further, the sequence of operations described in connection with FIGS. 5-6 are an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A datacenter environment may include a plurality of server enclosures (or server racks), where each server enclosure may include one or more power supply devices that is directly connected to one or more loads of each server enclosure. In such examples, each of the one or more power supply devices may supply (or transmit) a power to a respective load of the one or more loads to seamlessly perform its intended functions. The one or more loads may be construed as electronic components of the server enclosure, which may include main electronic components and auxiliary electronic components. The main electronic components may include processors, memory devices, storage devices, or networking devices. Further, the main electronic components may be installed in a node (or tray), for example, a server node, a switch node, a storage node, or etc. Further, the node having such main electronic components may be housed in the server enclosure. Similarly, the auxiliary electronic components may include fans, liquid cooling devices, controllers, or etc. Further, the auxiliary components may be either installed in the node along with the main electronic components, or may be directly installed in the server enclosure.

Generally, the server enclosure is a modular component, because it can house and support a plurality of nodes depending on its size. For example, an administrator may add or remove the nodes from the server enclosure depending on a customer's business requirements. Similarly, the administrator may add or remove the power supply device from the server enclosure in order to cater the power requirements of the one or more nodes housed in the server enclosure. However, when a load current drawn by the one or more loads (e.g., electronic components) in the nodes and/or in the server enclosure exceeds a power supply capacity of the one or more power supply devices (i.e., during an overcurrent event), then the one or more power supply devices may latch-off from transmitting the power to the one or more loads. In such scenarios, the administrator may have to physically visit the datacenter environment for restoring the one or more power supply devices. For example, the administrator may have to physically remove and reinsert the power cord (e.g., alternating current power cord), or physically reset the entire power supply devices in the server enclosure. Further, the process of restoring the one or more power supply devices may be a tedious and time consuming process, because it may require identifying a right number of power supply devices, and turning-on all of the identified number of power supply devices at once, to overcome the overcurrent event. Accordingly, there is a requirement for a control system that may automatically manage the transmission of the power from the one or more power supply devices to the one or more loads without latching-off the one or more power supply devices during the overcurrent event.

A technical solution to the aforementioned problems may include providing a power control system disposed between one or more power supply devices and one or more loads for controlling a transmission of a power from the one or more power supply devices to the one or more loads. For example, the power control system may include: an electronic fuse connected between the one or more power supply devices and the one or more loads; and a threshold control circuit connected to the electronic fuse and to the one or more power supply devices. In such examples, the threshold control system may dynamically adjust a threshold current for the electronic fuse based on a power supply capacity of the one or more power supply devices. Later, the electronic fuse may control the transmission of the power based on the threshold current and a load current drawn by the one or more loads.

In one or more examples, the threshold control circuit automatically determines the power supply capacity of the one or more power supply devices based on a number of power supply devices deployed in the modular server enclosure. Further, the threshold control circuit dynamically adjusts the threshold current in the electronic fuse based on the determined power supply capacity. For example, the threshold control circuit may first set the threshold current to ninety percent of the power supply capacity of the one or more power supply devices. Later, the threshold control circuit may dynamically adjust the threshold current for the electronic fuse. In such examples, after the threshold current is adjusted, the electronic fuse may control the transmission of the power from the one or more power supply devices to one or more loads based on the threshold current and the load current drawn by the one or more loads. For example, the electronic fuse may continue the transmission of the power in response to determining that the load current is less than the threshold current. However, the electronic fuse may trip-off to discontinue the transmission of the power in response to determining that the load current is greater than the threshold current. Thus, the power control system may prevent the one or more power supply devices from latching-off during an overcurrent event in the modular server enclosure.

In some examples, the threshold control circuit may automatically re-determine the power supply capacity of the one or more power supply devices, in response to an addition of a new power supply device. Later, the threshold control system may dynamically re-adjust the threshold current for the electronic fuse based on the re-determined power supply capacity.

The power control system may additionally include one or more other circuits, such as a pulse generator circuit and a buffer amplifier for automatically resetting the electronic fuse in order to restore the transmission of the power from the one or more power supply devices to the one or more loads. For example, the pulse generator circuit may generate a trigger pulse to the buffer amplifier in response to determining: i) the addition of the new power supply device to the modular server enclosure; and/or ii) a removal of at least one load among the one or more loads from the modular server enclosure. The pulse generator circuit may transmit the trigger pulse to the buffer amplifier. In one or more examples, the buffer amplifier may receive a power good signal from the electronic fuse, which is indicative of a present state of the electronic fuse. The electronic fuse may generate the power good signal, when the electronic fuse is transmitting the power, i.e., in a non-latched-off state. However, the electronic fuse may not generate the power good signal, when the electronic fuse is not transmitting the power, i.e., in a latched-off state. In some other examples, the power good signal may have a high voltage or a low voltage. In some examples, the high voltage is about 5 volts (V) and the low voltage is about 0V. In such examples, the electronic fuse may generate a 5V power good signal, when the electronic fuse is in the non-latched off state, and generate a 0V power good signal, when the electronic fuse is in the latched-off state. In such examples, the buffer amplifier, in response to receipt of the trigger pulse from the pulse generator circuit, and non-receipt of the power good signal (or receipt of the 0V power good signal) from the electronic fuse, may generate a reset signal to the electronic fuse. Thus, electronic fuse may automatically reset upon receipt of the reset signal in order to re-transmit the power from the one or more power supply devices to the one or more loads. In other words, the buffer amplifier generates the reset signal to reset the electronic fuse to allow the transmission of the power from the one or more power supply devices to the one or more loads based on receipt of the trigger pulse from the pulse generator circuit, and the power good signal from the power good output pin.

In some examples, the logic employed in the threshold control circuit, the pulse generator circuit, and the buffer amplifier may be encoded in a microcontroller. In such examples, the microcontroller may be communicatively coupled to the electronic fuse for controlling the transmission of the power from the one or more power supply devices to the one or more loads.

In some examples, the one or more power supply devices may include main power supply devices and auxiliary power supply devices. In some examples, the main power supply device may supply a power greater than 12V, and the auxiliary power supply device may supply the power equal to or less than 12V. The one or more loads may be construed as one or more electronic components of the modular server enclosure, which may operate using the power transmitted from the one or more power supply devices to perform their intended functions. In one or more examples, the one or more electronic components may include main electronic components and auxiliary electronic components. For example, the main electronic components may include processors, memory devices, storages, network devices, or etc. which may require the power supply of greater than 12V. The auxiliary electronic components may include fans, liquid cooling devices, controllers, or etc. which may require the power supply of equal to and/or lower than 12V. In one or more examples, the electronic fuse is disposed between the one or more auxiliary power supply devices and the one or more auxiliary loads to control the transmission of the power there between, without deviating from the scope of the present disclosure.

Accordingly, the present disclosure describes example implementations of a power control system for controlling a transmission of a power from one or more power supply devices to one or more loads of a modular server enclosure. The power control system includes an electronic fuse and a threshold control unit. The electronic fuse is connected between the one or more power supply devices and the one or more loads of the modular server enclosure. The threshold control unit is connected to the electronic fuse and to the one or more power supply devices. The threshold control circuit dynamically adjusts a threshold current for the electronic fuse based on a power supply capacity of the one or more power supply devices. The electronic fuse controls the transmission of the power from the one or more power supply devices to the one or more loads based on the threshold current and a load current drawn by the one or more loads.

FIG. 1 depicts a block diagram of a modular server enclosure 100 having one or more power supply devices 102, one or more loads 104 (e.g., electric load/electronic load), a power control system 106, a power supply backplane 108, and an enclosure backplane 110. In some examples, the modular server enclosure 100 is a blade server enclosure. In some other examples, the modular server enclosure 100 may be a rack server enclosure. In one or more examples, the modular server enclosure 100 may include a plurality of compartments, which may be configured to house and support the one or more power supply devices 102 and the one or more loads 104 depending on a customer's requirements.

Each of the one or more power supply devices 102 may be an electrical device that supplies an electric power to one or more loads 104. The one or more power supply devices 102 is used to convert electric power from a power source (not shown) to a correct voltage, current, and frequency so as to power the one or more loads 104 for performing their intended functions. For example, the one or more power supply devices 102 may be connected to the power source of the datacenter environment in order to receive the electric power from the power source, and transmit power to the one or more loads 104 at suitable levels. In some examples, the one or more power supply devices 102 may include one or more main power supply devices (not shown) and one or more auxiliary power supply devices 102A. It may be noted herein that the one or more main power supply devices are not shown in the example of FIG. 1, for ease of illustration purposes, and such an illustration should not be construed as a limitation of the present disclosure. Each of the one or more main power supply devices may transmit power which is greater than 12V to the one or more loads 104. Moreover, each of the one or more auxiliary power supply devices 102A may transmit power which is equal to 12V and/or lower than 12V to the one or more loads 104.

The power supply backplane 108 may be coupled to a base or a side wall of the modular server enclosure 100 for providing support to the one or more power supply devices 102. In one or more examples, the power supply backplane 108 may have first electrical connectors (not shown) for receiving first electric pins (not shown) of the one or more power supply devices 102, and connect them together to form a supply electric circuit of the modular server enclosure 100.

Each of the one or more loads 104 is an electrical component, an electronic component, or a portion of a circuit that consumes the electric power transmitted from the one or more power supply devices 102 for performing its intended functions. In some examples, the one or more loads 104 may include one or more main electronic components and one or more auxiliary electronic components. For example, the one or more main electronic components may include processors, memory devices, storage devices, network devices, or etc. of the modular server enclosure 100. Moreover, the one or more auxiliary electronic components may include fans, liquid cooling devices, controllers, or etc. of the modular server enclosure 100. In such examples, the one or more main electronic components may be installed in a node, for example, a server node 105A, a switch node 105B, a storage node 105C, or etc. Further, the node having such main electronic components may be housed in the compartments of the modular server enclosure 100. Similarly, the auxiliary electronic components may include fans and/or liquid cooling devices 105D, controllers (not labeled), or etc. In some examples, the auxiliary components, such as the controller (e.g., a baseboard management controller) may be either installed within the node, for example, the server node 105A, the switch node 105B, or the storage node 105C along with the main electronic components. In some other examples, the auxiliary components, such as fans or the liquid cooling devices 105D may be directly installed in the modular server enclosure 100.

The enclosure backplane 110 may provide support to the one or more loads 104. Further, the enclosure backplane 110 may have second electrical connectors (not shown) for receiving second electric pins (not shown) of the one or more loads 104 (e.g., of the one or more main or auxiliary components), and connecting the second electric pins together to form the load electric circuit.

In one or more examples, the modular server enclosure 100 may further include one or more bus bars 112 for connecting the supply electric circuit formed by the power supply backplane 108 to the load electric circuit formed by the enclosure backplane 110. In such examples, the one or more bus bars 112 may carry (or transmit) the power from the one or more power supply devices 102 to the one or more loads 104 via the power control system 106.

The power control system 106 is disposed between the one or more power supply devices 102 and the one or more loads 104. In some examples, the power control system 106 receives the power supply from the one or more power supply devices 102 and transmits the received power to the one or more loads 104. In one or more examples, the power control system 106 functions as a power regulator, which dynamically selects transmission of the power output to the one or more loads 104 in order to prevent the latching-off of one or more power supply devices during the overcurrent event. The power control system 106 may include one or more components, such as a plurality of circuits (shown in FIG. 2), one or more microcontrollers, or etc., for controlling the supply of the power from the one or more power supply devices 102 to the one or more loads 104. It may be noted herein, that the one or more components, and their functions in the power control system 106 are discussed in greater detail below.

The modular server enclosure 100 is a flexible computing system enclosure. For example, an administrator may add or remove (as shown in dotted lines in FIG. 1) the loads 104 (i.e., trays having the electronic components) from the modular server enclosure 100 depending on a customer's business requirements. Similarly, the administrator may add or remove the power supply devices 102 from the modular server enclosure 100 in order to cater the power requirements of the one or more loads 104 housed in the modular server enclosure 100. However, due to the dynamic addition of the load 104 or the removal of the power supply device 102, a load current drawn by the one or more loads 104 may exceed a power supply capacity of the one or more power supply devices 102. In such scenarios, the power control system 106 of the present disclosure may automatically discontinue the transmission of the power from the one or more power supply devices 102 to the one or more loads 104, thereby preventing the overcurrent event in the modular server enclosure 100, and latching-off of the one or more power supply devices 102.

Figure 2:
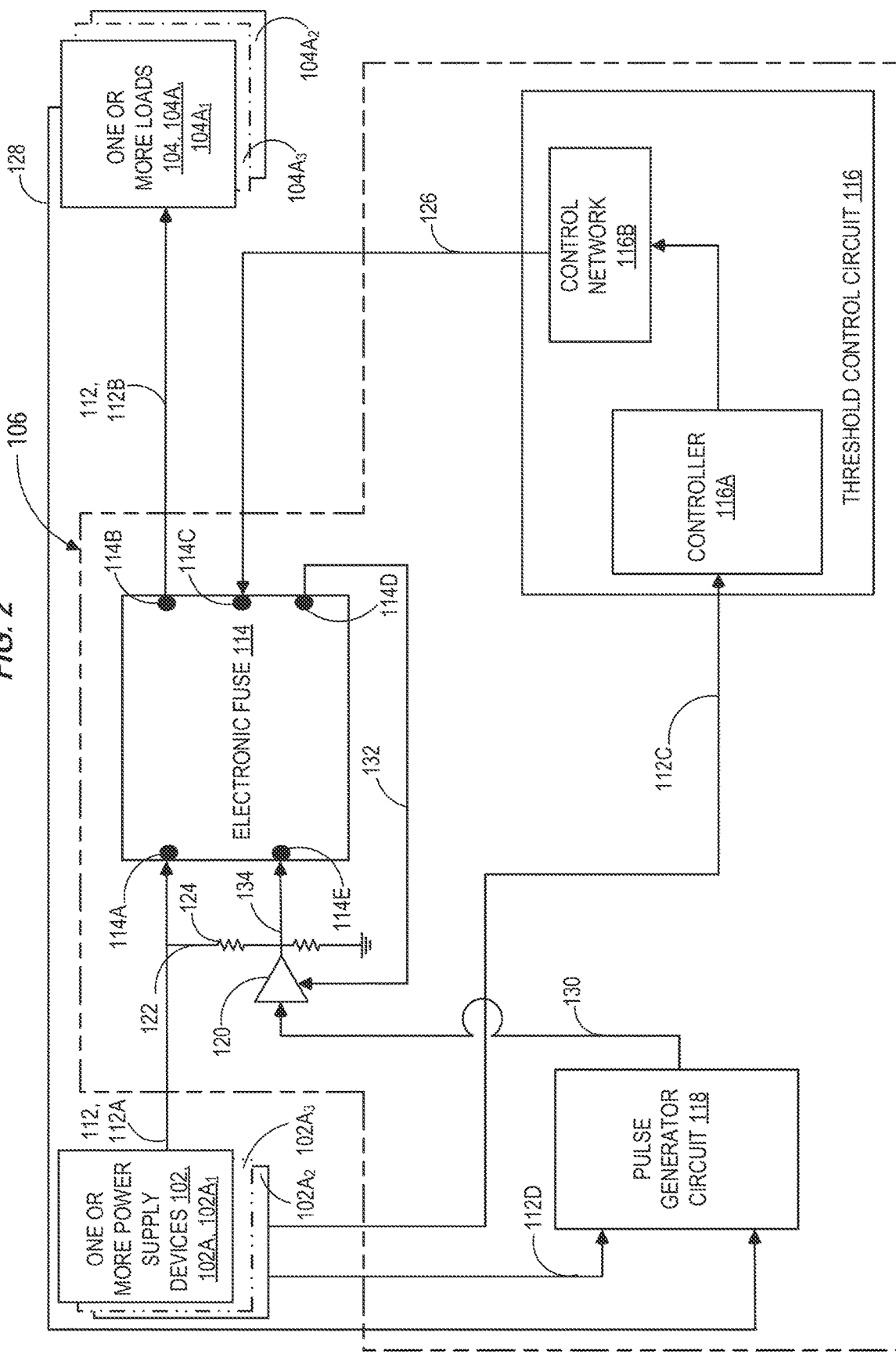
FIG. 2 is a block diagram depicting a power control system of the modular server enclosure of FIG. 1 according to an example implementation of the present disclosure.
Figure 3:
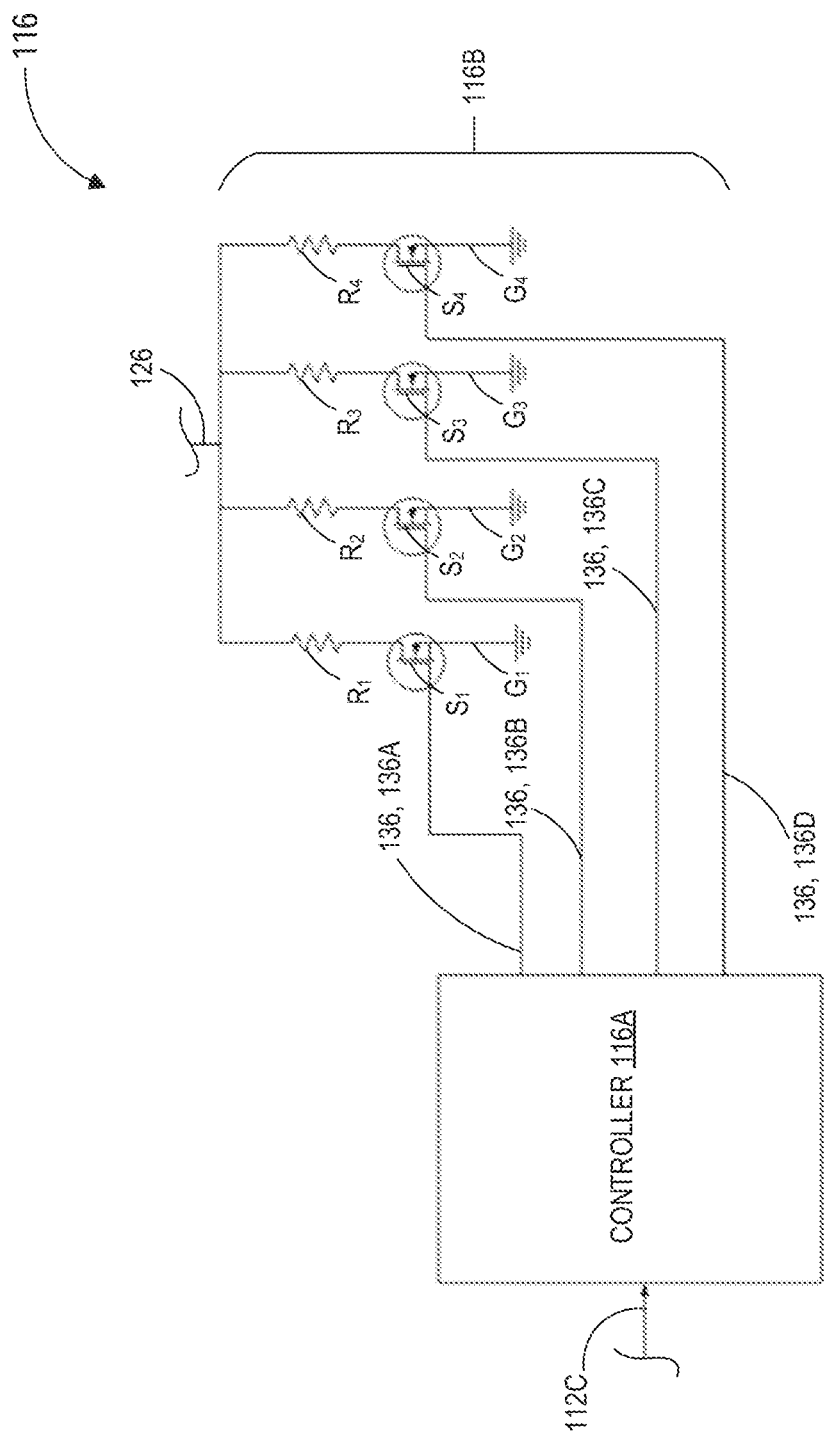
FIG. 3 is a block diagram depicting a threshold control circuit of the power control system of FIG. 2 according to another example implementation of the present disclosure.
Figure 4:
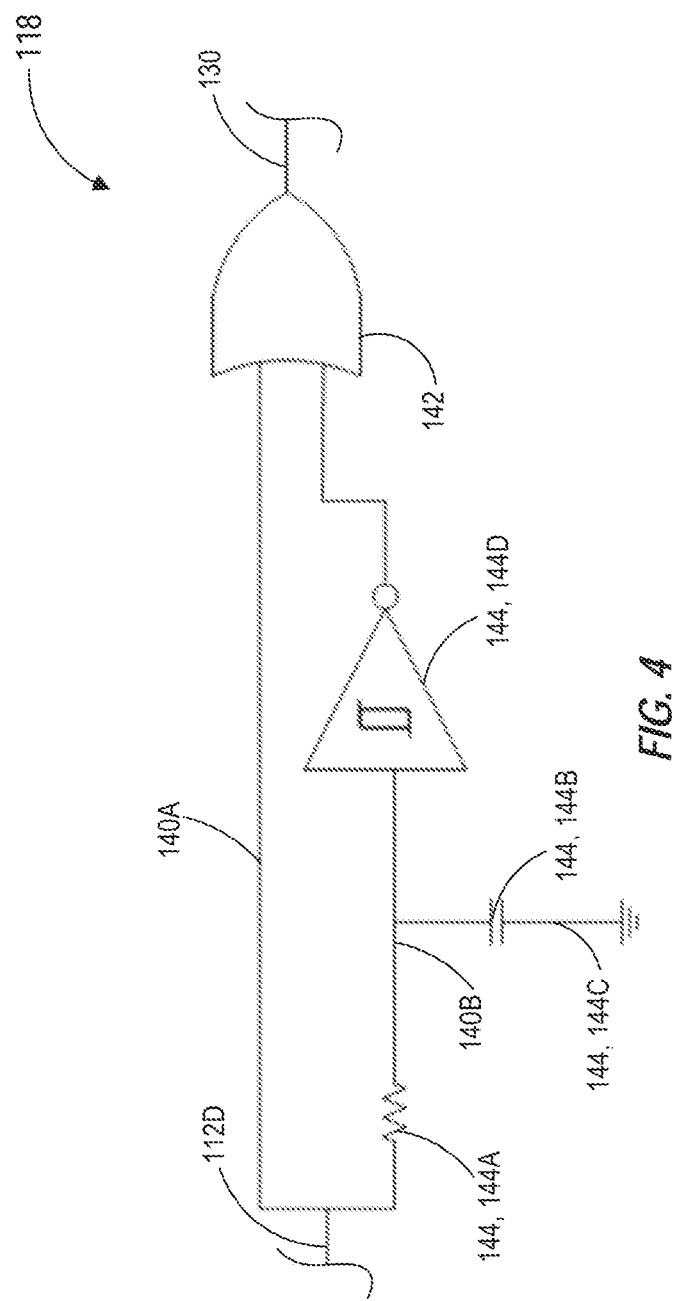
FIG. 4 is a block diagram depicting a pulse generator circuit of the power control system of FIG. 2 according to another example implementation of the present disclosure.

FIG. 2 depicts a block diagram of a power control system 106 of the modular server enclosure 100 of FIG. 1. FIG. 3 depicts a threshold control circuit 116 of the power control system 106 of FIG. 2. FIG. 4 depicts a pulse generator circuit 118 of the power control system 106 of FIG. 2. In the description hereinafter, FIGS. 2-4 are described concurrently for ease of illustration.

In the example of FIG. 2, each of the one or more power supply devices 102 is an auxiliary power supply device 102A, and each of the one or more loads 104 is an auxiliary load 104A. For example, the modular server enclosure 100 may include two auxiliary power supply devices 102A. In the example of FIG. 2 the two auxiliary power supply devices 102A includes a first auxiliary power supply devices $102A_1$ and a second auxiliary power supply devices $102A_2$. Similarly, the modular server enclosure 100 may include two auxiliary loads 104A. In the example of FIG. 2, the two auxiliary loads includes a first auxiliary load $104A_1$ and a second auxiliary load $104A_2$. In some other examples, each of the one or more power supply devices 102 may be a main power supply device, and each of the one or more loads 104 may be a main load, without deviating from the scope of the present disclosure. In some other examples, the one or more power supply devices 102 may be a combination of the main and auxiliary power supply devices, and the one or more loads 104 may be a combination of the main and auxiliary loads, without deviating from the scope of the present disclosure. In one or more examples, the power control system 106 includes a plurality of internal components, such as an electronic fuse 114, a threshold control circuit 116, a pulse generator circuit 118, and a buffer amplifier 120.

The electronic fuse 114 (also referred to as an e-fuse) is connected between the one or more power supply devices 102, and the one or more loads 104. For example, the electronic fuse 114 is connected to the one or more auxiliary power supply devices 102A via a first input bus bar 112A of the one or more bus bars 112. Similarly, the electronic fuse 114 is further connected to the one or more auxiliary loads 104A via an outlet bus bar 112B of the one or more bus bars 112. Further, the first input bus bar 112A may be grounded using a grounding bus bar 122 having one or more resistors 124. It may be noted herein, that the grounding bus bar 122 may egress the surge in the electric power from the one or more auxiliary power supply devices 102A to the ground in order to protect downstream components of the modular server enclosure 100. In some examples, the downstream components may include the plurality of internal components of the power control system 106, the one or more auxiliary loads 104A, and etc. The electronic fuse 114 regulates the transmission of the power from the one or more auxiliary power supply devices 102A to the one or more auxiliary loads 104A. In one or more examples, the electronic fuse 114 includes a plurality of pins, for example, a power input pin 114A, a power output pin 114B, a threshold current set pin 114C, a power good output pin 114D, and a reset pin 114E.

The power input pin 114A is connected to the one or more auxiliary power supply devices 102A via the first input bus bar 112A, and the power output pin 114 6 is connected to the one or more auxiliary loads 104A via the outlet bus bar 112B. In the example of FIG. 2, the power input pin 114A receives power, which is equal to and/or lower than 12V from the one or more auxiliary power supply devices 102A. In such examples, the power output pin 114B transmits the received power to the one or more auxiliary loads 104A.

The threshold current set pin 114C is connected to the threshold control circuit 116. In some examples, the threshold current set pin 114C is dynamically adjusted for a value, e.g., a threshold current by the threshold control circuit 116 based on a power supply capacity of the one or more auxiliary power supply devices 102A. In such examples, the power output pin 114B of the electronic fuse 114 transmits (or continues transmitting) the power to the one or more auxiliary loads 104A until a load current drawn by the one or more auxiliary loads 104A is less than the threshold current. In such examples, when the load current exceeds the threshold current, then the power output pin 114B may discontinue transmitting the power to the one or more auxiliary loads 104A.

The power good output pin 114D is connected to the buffer amplifier 120. In some examples, the power good output pin 114D functions as an indicator pin representative of the transmission of the power to the one or more auxiliary loads 104A. In some examples, the power good output pin 114D generates a power good signal, when the power output pin 114 6 is transmitting the power to the one or more auxiliary loads 104A. However, the power good output pin 114D may not generate the power good signal, when the power output pin 114 6 is not transmitting the power to the one or more auxiliary loads 104A. In some other examples, the power good output pin 114D may generate a high voltage power good signal, when the power output pin 114B is transmitting the power to the one or more auxiliary loads 104A. Similarly, the power good output pin 114D may generate a low voltage power good signal, when the power output pin 114 6 is not transmitting the power to the one or more auxiliary loads 104A. In some examples, the high voltage is about 5V and the low voltage is about 0V.

The reset pin 114E is connected to the buffer amplifier 120. In some examples, the reset pin 114E may be set to an enabled state or a disabled state by the buffer amplifier 120. When the reset pin 114E is in the disabled state, the power output pin 114B may not transmit the power to the one or more auxiliary loads 104A. However, when the reset pin 114E is in the enabled state, the power output pin 114B may transmit the power to the one or more auxiliary loads 104A. The conditions applicable for the buffer amplifier 120 to generate a reset signal to set the reset pin 114E to the enabled state are explained in greater details below.

The threshold control circuit 116 is connected to the one or more auxiliary power supply devices 102A via a second inlet bus bar 112C of the one or more bus bars 112. Further, the threshold control circuit 116 is connected to the electronic fuse 114, for example, to the threshold current set pin 114C via a threshold bus bar 126. In one or more examples, the threshold control circuit 116 may function like a regulator circuit that is configured to dynamically adjust the threshold current for the electronic fuse 114 based on a power supply capacity of the one or more auxiliary power supply devices 102A. In such examples, the threshold control circuit 116 receives a signal representative of i) a number of auxiliary power supply devices 102A among the one or more auxiliary power supply devices 102A connected to the modular server enclosure 100, and ii) whether all of the number of auxiliary power supply devices 102A are connected to the input power (or power source) of the datacenter environment. Accordingly, the threshold control circuit 116 determines the power supply capacity of the one or more auxiliary power supply devices 102A using internal components, such as a controller 116A and a control network 116B. After the threshold control circuit 116 determines the power supply capacity of the one or more auxiliary power supply devices 102A, the threshold control circuit 116 dynamically adjusts the threshold current in the threshold current set pin 114C. In some examples, the threshold current is about ninety percent of the power supply capacity of the one or more auxiliary power supply devices 102A. In one or more examples, the threshold control circuit 116 may dynamically adjust the threshold current passing through the threshold current set pin 114C via the threshold bus bar 126. In some other examples, the threshold control circuit 116 may dynamically adjust the threshold current to about eighty five percent of the power supply capacity of the one or more auxiliary power supply devices 102A. Accordingly, in one or more examples, the power output pin 114<i>6</i> of the electronic fuse 114 transmits the power to the one or more auxiliary loads 104A, when the load current of the one or more auxiliary loads 104A is less than the threshold current. In some examples, when the load current exceeds the threshold current, then the power output pin 114<i>6</i> may discontinue the transmission of the power to the one or more auxiliary loads 104A. The threshold control circuit 116 is discussed in greater details below with reference to the example of FIG. 3. For example, the details about the internal components of the threshold control circuit 116, and the steps of determining the power supply capacity of the one or more auxiliary power supply devices 102A, and adjusting the threshold current for the electronic fuse 114, are discussed in greater details below with reference to the example of FIG. 3.

The pulse generator circuit 118 is connected to the one or more auxiliary power supply devices 102A, the one or more auxiliary loads 104A, and the buffer amplifier 120. In some examples, the pulse generator circuit 118 is connected to the one or more auxiliary power supply devices 102A via a third inlet bus bar 112D among the one or more bus bars 112. Further, the pulse generator circuit 118 is connected to the one or more auxiliary loads 104A via a load bus bar 128.

Similarly, the pulse generator circuit 118 is connected to the buffer amplifier 120 via a pulse bus bar 130. In one or more examples, upon addition of a new auxiliary power supply device to the modular server enclosure 100, the pulse generator circuit 118 may receive a signal indicative of the addition of the new auxiliary power supply device via the third inlet bus bar 112D. In some other examples, the signal indicative of the addition of the new auxiliary power supply device may be in a form of an increase in a voltage or a current. Similarly, when an auxiliary load among the one or more auxiliary loads 104A is removed from the modular server enclosure 100, the pulse generator circuit 118 may receive the signal indicative of the removal of the auxiliary load via the load bus bar 128. In some other examples, the signal indicative of the removal of the auxiliary load may be in a form of decrease in the voltage or the current. In such examples, the pulse generator circuit 118 generates a trigger pulse to the buffer amplifier 120. In other words, the pulse generator circuit 118 may generate the trigger pulse upon one or more pre-determined conditions including: i) the addition of the new auxiliary power supply device to the one or more auxiliary power supply devices 102A; or ii) the removal of the auxiliary load from the one or more auxiliary loads 104A. In some examples, the pulse generator circuit 118 may include one or more electronic components for generating the trigger pulse based on the one or more pre-determined conditions, which are discussed in greater details with reference to the example of FIG. 4. The pulse generator circuit 118 may transmit the trigger pulse to the buffer amplifier 120 via the pulse bus bar 130.

The buffer amplifier 120 is connected to one or more pins of the electronic fuse 114, for example, to the power good output pin 114D via a power good output bus bar 132, and to the reset pin 114E via a reset bus bar 134. Further, the buffer amplifier 120 is connected to the pulse generator circuit 118 via the pulse bus bar 130. In such examples, the buffer amplifier 120 may receive at least one of the trigger pulse from the pulse generator circuit 118 and the power good signal from the power good output pin 114D of the electronic fuse 114. Accordingly, the buffer amplifier 120 may either generate a reset signal or may not generate the reset signal depending on a pre-determined condition. In some examples, the pre-determined condition includes i) receipt of the trigger pulse from the pulse generator circuit 118, and ii) non-receipt of the power good signal (or receipt of a 0V power good signal) from the power good output pin 114D of the electronic fuse 114. In one or more examples, the buffer amplifier 120, in response to the receipt of the trigger pulse and non-receipt of the power good signal (or receipt of a 0V power good signal), generates and transmits the reset signal to the reset pin 114E via the reset bus bar 134. The reset signal sets the reset pin 114E to the enabled state from the disabled state, to allow the power output pin 114<i>6</i> to transmit the power from the one or more auxiliary power supply devices 102A to the one or more auxiliary loads 104A. In some other examples, the buffer amplifier 120, upon receipt of i) the trigger pulse, and ii) the power good signal (i.e., 5V power good signal), may not generate the trigger pulse. Similarly, the buffer amplifier 120, upon non-receipt of i) the trigger pulse, and ii) the power good signal (i.e., a 5V power good signal) may not generate the reset signal. Therefore, the buffer amplifier 120 may generate the reset signal based on the pre-determined condition as discussed herein, and transmit the reset signal to the electronic fuse 114 for resetting the electronic fuse 114 and allowing the power output pin 114B to transmit the power from the one or more auxiliary power supply devices 102A to the one or more auxiliary loads 104A.

Referring to FIG. 3, the threshold control circuit 116 includes a controller 116A and a control network 116B. In one or more examples, the controller 116A is connected to the one or more auxiliary power supply devices 102A via second inlet bus bar 112C. The control network 116B is connected to the threshold current set pin 114C (as shown in FIG. 2) via the threshold bus bar 126. In such examples, the controller 116A is further connected to the control network 116B.

In one or more examples, the control network 116B includes a plurality of parallel circuit paths 136, wherein each parallel path is connected to the controller 116A and the combination of the parallel circuit paths 136 is further connected to the threshold bus bar 126. In some examples, each circuit path of the plurality of parallel circuit paths 136 includes a resistor connected in series with a switch. For example, a first circuit path 136A of the plurality of parallel circuit paths 136 has a first resistor $R_1$, a first switch $S_1$, and a first grounding bus bar $G_1$. Similarly, a second circuit path 136B of the plurality of parallel circuit paths 136 has a second resistor $R_2$, a second switch $S_2$, and a second grounding bus bar $G_2$. A third circuit path 136C of the plurality of parallel circuit paths 136 has a third resistor $R_3$, a third switch $S_3$, and a third grounding bus bar $G_3$. Further, a fourth circuit path 136D of the plurality of parallel circuit paths 136 has a fourth resistor $R_4$, a fourth switch $S_4$, and a fourth grounding bus bar $G_4$. In some examples, each of the switches $S_1$, $S_2$, $S_3$, $S_4$ may keep a respective circuit path of the plurality of parallel circuit paths 136 in an open state. In other words, the control network 116B may not allow the power signal to flow from one or more auxiliary power supply devices 102A to the threshold current set pin 114C until the control network 116B receives a control signal from the controller 116A. In some examples, the control signal is indicative of the power supply device connected or plugged to the modular server enclosure. Each of the respective switches $S_1$, $S_2$, $S_3$, $S_4$ may get closed, upon receipt of the control signal to establish (or form) the corresponding circuit path of the plurality of parallel circuit paths 136. In some examples, the controller 116A generates the control signals based on a number of auxiliary power supply devices 102A connected to the modular server enclosure 100.

Referring to FIG. 2, since the modular server enclosure 100 has two auxiliary power supply devices 102A, the controller 116A generates two control signals to the first and second circuit paths 136A, 136B to control operation of the respective switches $S_1$, $S_2$. In such examples, the power signal received from the one or more auxiliary power supply devices 102A flows through the respective resistors $R_1$, $R_2$ in the first and second circuit paths 136A, 136B for adjusting an effective resistance of the control network 116B to enable determination of the power supply capacity of the one or more auxiliary power supply devices 102A and dynamic adjustment of the threshold current. For example, the flow of the power signal in two parallel circuit paths $S_1$, $S_2$, may have less resistance, thereby increasing a net current at the threshold bus bar 126. Thus, the net current at the threshold bus bar 126 may enable the controller 116A to determine the power supply capacity of the one or more auxiliary power supply devices 102A. After the power supply capacity is determined, the controller 116A may set the threshold current as ninety percent of the power supply capacity, for example. Later, the controller 116A may dynamically adjust the threshold current for the threshold current set pin 114C of the electronic fuse 114. In some examples, the logic employed in the threshold control circuit 116 may be encoded in a microcontroller.

Referring to FIG. 4, the pulse generator circuit 118 includes a first signal path 140A and a second signal path 140B connected to an OR-gate 142. In some examples, the first and second signal paths 140A, 140B are connected to the one or more auxiliary power supply devices 102A via the third inlet bus bar 112D for receiving a signal, for example, a power signal from the one or more auxiliary power supply devices 102A. The first and second signal paths 140A, 140B may be additionally connected to the one or more auxiliary loads 104A via the load bus bar 128 for receiving the signal, for example, a load signal from the one or more auxiliary loads 104A. It may be noted herein that the example of FIG. 4 does not illustrate the load bus bar 128 connected to the first and second signal paths 140A, 140B for ease of illustration, and such an illustration should not be construed as a limitation of the present disclosure. The OR-gate 142 is connected to the buffer amplifier 120 via the pulse bus bar 130.

The first signal path 140A is directly connected to the OR-gate 142, whereas the second signal path 140B includes an RC circuit 144 before connecting to the OR-gate 142. In some examples, the RC circuit 144 includes a resistor 144A, a capacitor 144B, a grounding bus bar 144C, and an inverter 144D. In one or more examples, the first signal path 140A and the second signal path 140B transmit the signal from at least one of the one or more auxiliary power supply devices 102A or the one or more auxiliary loads 104A to the OR-gate 142.

In some examples, the first signal path 140A, upon receipt of the power signal from an addition of a new auxiliary power supply device to the modular server enclosure 100, may directly transmit the power signal to the OR-gate 142 without any delay. However, the RC circuit 144 in the second signal path 140B, upon the receipt of the power signal due to the addition of the new auxiliary power supply device, may delay the transfer of the power signal and generate the trigger pulse to the OR-gate 142. For example, the resistor 144A and the capacitor 144B delay the transfer of the power signal, thereby causing the inverter 144D to generate the trigger pulse to the OR-gate 142. In some other examples, the RC circuit 144 in the second signal path 140B, upon removal of the one or more auxiliary loads 104A from the modular server enclosure, may delay transfer of the load signal and generate the trigger pulse to the OR-gate 142. For example, the resistor 144A and the capacitor 144B delay the transfer of the load signal, thereby causing the inverter 144D to generate the trigger pulse to the OR-gate 142. In some examples, the logic employed in the pulse generator circuit 118 and the buffer amplifier 120 may be encoded in a microcontroller.

Referring back to FIGS. 1-4, during operation of the modular server enclosure 100, the electronic fuse 114, the threshold control circuit 116, and the pulse generator circuit 118 may receive a power signal from the one or more auxiliary power supply devices 102A. In such examples, the threshold control circuit 116 may first dynamically determine the power supply capacity of the one or more auxiliary power supply devices 102A, as discussed herein with reference to FIG. 3. In some examples, the threshold control circuit 116 may determine the power supply capacity of the two auxiliary power supply devices $102A_1$, $102A_2$, as 100 Amps. Later, the threshold control circuit 116 may dynamically adjust the threshold current for the electronic fuse 114 based on the determined power supply capacity of the two auxiliary power supply devices $102A_1$, $102A_2$. In some examples, the threshold control circuit 116 sets the threshold current as ninety percent of the determined power supply capacity, which is about 90 amperes (Amps). Accordingly, the threshold control circuit 116 dynamically adjusts the threshold current as 90 Amps for the threshold current set pin 114C.

Further, the power output pin 114B of the electronic fuse 114 may allow the transmission of the power from the one or more auxiliary power supply devices 102A to the one or more auxiliary loads 104A. The power output pin 114B may simultaneously measure the load current drawn by the one or more auxiliary loads 104A (i.e., from the first and second auxiliary loads $104A_1$, $104A_2$). In some examples, the load current measured by the power output pin 114B may be about 80 Amps. The electronic fuse 114 may later determine whether the load current drawn by the one or more auxiliary loads 104A exceeds the threshold current. In response to determining that the load current is less than the threshold current, the power output pin 114B may continue the transmission of the power to the one or more auxiliary loads 104A. Further, the power good output pin 114D of the electronic fuse 114 may generate the power good signal. In such examples, the buffer amplifier 120 may receive the power good signal from the power good output pin 114D.

In some examples, an administrator of the datacenter environment may add a third auxiliary load $104A_3$ to the modular server enclosure 100, to meet customer's business requirement. In such examples, the power output pin 114B of the electronic fuse 114 may once again measure the load current drawn by the auxiliary loads 104A (i.e., the first, second, and third auxiliary loads $104A_1$, $104A_2$, $104A_3$). In some examples, the load current measured by the power output pin 114B may be about 120 Amps. Accordingly, the electronic fuse 114 may determine that the load current drawn by the one or more auxiliary loads 104A is greater than the one or more auxiliary power supply devices 102A, resulting in an overcurrent event. During such scenario (i.e., overcurrent event), the electronic fuse 114 may latch-off from transmitting the power to the one or more auxiliary loads 104A. For example, the reset pin 114E is set to the disabled state from the enabled state, and the power output pin 114B is latched-off so as to discontinue the transmission of the power from the one or more auxiliary power supply devices 102A to the one or more auxiliary loads 104A. Further, when the reset pin 114E of the electronic fuse 114 is in the disabled state, the power good output pin 114D of the electronic fuse 114 may not generate the power good signal or generate the low voltage power good signal (i.e., 0V power good signal). Thus, the buffer amplifier 120 may not receive the power good signal from the power good output pin 114D of the electronic fuse 114 or receive the 0V power good signal.

Further, as discussed hereinabove with reference to FIG. 2, the addition of third auxiliary load $104A_3$ may not result in generating a load signal to the pulse generator circuit 118. Additionally, the electronic fuse 114 is still in the disabled state, hence the power good output pin 114D does not generate the power good signal. Therefore, the buffer amplifier 120 may not receive the power good signal from the electronic fuse 114 and the trigger pulse from the pulse generator circuit 118. Thus, the buffer amplifier 120 may not generate the reset signal for resetting the electronic fuse 114 from the disabled state to the enabled state. Accordingly, the electronic fuse 114 may continue to remain in the latched-off state, thereby discontinuing the transmission of the power to the one or more auxiliary loads 104A.

To address such overcurrent event, the administrator of the modular server enclosure 100 may add a third auxiliary power supply device $102A_3$ to the modular server enclosure 100. In such examples, the threshold control circuit 116 re-determines the power supply capacity of the one or more auxiliary power supply devices 102A (i.e., for the first, second, and third auxiliary power supply devices $102A_1$, $102A_2$, $102A_3$). In some examples, the threshold control circuit 116 may determine that the power supply capacity of the three auxiliary power supply devices 102A is about 150 Amps, for example (as discussed in the example of FIG. 3). Further, the threshold control circuit 116 sets the threshold current as ninety percent of the re-determined power supply capacity, which is about 135 Amps. Later, the threshold control circuit 116 adjusts the threshold current as 135 Amps in the threshold current set pin 114C of the electronic fuse 114. In one or more examples, the power output pin 114B of the electronic fuse 114 has already measured the load current drawn by the one or more auxiliary loads 104A (i.e., the first, second, and third auxiliary loads $104A_1$, $104A_2$, $104A_3$), which is about 120 Amps. Accordingly, the electronic fuse 114 determines that the load current drawn by the one or more auxiliary loads 104A is less than the one or more auxiliary power supply devices 102A.

In such examples, the addition of the third auxiliary power supply device $102A_3$ may result in simultaneously generating the additional power signal from the one or more auxiliary power supply devices 102A to the pulse generator circuit 118. The pulse generator circuit 118, upon receipt of the additional power signal (or a signal having an increase in voltage or current due to addition of third auxiliary power supply device $102A_3$), may generate the trigger pulse as discussed herein above with reference to FIG. 4. The pulse generator circuit 118 may transmit the trigger pulse to the buffer amplifier 120. Further, since the electronic fuse 114 is still in the disabled state, the power good output pin 114D does not generate the power good signal or generate a 0V power good signal. Thus, the buffer amplifier 120 may not receive the power good signal from the electronic fuse 114 or a 0V power good signal. In such examples, the buffer amplifier 120, upon receipt of the trigger pulse and non-receipt of the power good signal (or receipt of a 0V power good signal), generates the reset signal. The buffer amplifier 120 may further transmit the reset signal to the reset pin 114E of the electronic fuse 114. In such examples, the reset signal may set the reset pin 114E to the enabled state from the disabled state. After the electronic fuse 114 determines that the reset pin 114E is set to the enabled state, and the load current is less than threshold current, it allows the power output pin 114B to transmit the power from the one or more auxiliary power supply devices 102A to the one or more auxiliary loads 104A.

FIG. 5 is a flow diagram depicting a method 500 of controlling power supply from one or more power supply devices to one or more loads according to an example implementation of the present disclosure. It should be noted herein that the method 500 is described in conjunction with FIGS. 1-3. In one or more examples, a plurality of steps discussed in the method 500 is performed by an electronic fuse and a threshold control circuit of a power control system.

The method 500 starts at block 502 and continues to block 504. At block 504, the method 500 includes receiving a power from one or more power supply devices by an electronic fuse and a threshold control circuit of the power control system. The electronic fuse may have a power input pin for receiving the power from the one or more power supply devices of a modular server enclosure, and a power output pin to transmit the power to one or more loads. The electronic fuse may further include a threshold current set pin to set a threshold current for the electronic fuse, and a power good output pin to generate a power good signal upon transmission of the power to the one or more loads. The electronic fuse may further have a reset pin for setting the electronic fuse in an enabled state or a disabled state. The method 500 continues to block 506. In some examples, the one or more power supply devices includes main power supply devices and auxiliary power supply devices, and the one or more loads includes main loads and auxiliary loads, as described in the example of FIGS. 1-2.

At block 506, the method 500 includes dynamically adjusting the threshold current for the electronic fuse by the threshold control circuit, based on a power supply capacity of the one or more power supply devices. In some examples, the steps involved in performing the functions of the block 506 includes i) determining the power supply capacity of the one or more power supply devices, ii) setting the threshold current based on the determined power supply capacity, and iii) adjusting the threshold current for the threshold current set pin of the electronic fuse, as discussed in the example of FIGS. 2-3. The method 500 continues to block 508.

At block 508, the method 500 includes controlling a transmission of the power from the one or more power supply devices to one or more loads via the electronic fuse, based on the threshold current and a load current drawn by the one or more loads. In some examples, controlling the transmission includes determining whether the threshold current is less than the load current. In some examples, the electronic fuse, upon determination that the threshold current is greater than the load current, continues the transmission of the power from the one or more power supply devices to the one or more loads, as discussed in FIGS. 2-3. For example, the power output pin of the electronic fuse does not latch-off in order to transmit the power to the one or more loads, if the threshold current is greater than the load current. In some other examples, the electronic fuse, upon determination that the threshold current is less than the load current, discontinues the transmission of the power from the one or more power supply devices to the one or more loads, as discussed in FIGS. 2-3. For example, the power output pin of the electronic fuse latches-off in order to discontinue the transmission of the power to the one or more loads, if the threshold current is less than the load current. The method 500 ends at block 510.

FIG. 6 is a flowchart depicting a method 600 of automatically resetting an electronic fuse to allow a transmission of a power from one or more power supply devices to one or more loads according to an example implementation of the present disclosure. It should be noted herein that the method 600 is described in conjunction with FIGS. 1-4. In one or more examples, a plurality of steps discussed in the method 600 is performed by an electronic fuse, a threshold control circuit, a pulse generator circuit, and a buffer amplifier of a power control system.

The method 600 starts at block 602 and continues to block 604. At block 604, the method 600 includes discontinuing a transmission of a power from one or more power supply devices to one or more loads via an electronic fuse, if a threshold current is less than a load current (i.e., due to an overcurrent event). In some examples, discontinuing the transmission of the power includes latching-off the power output pin of the electronic fuse to discontinue the transmission of the power from the one or more power supply devices to the one or more loads, as discussed in the example of FIGS. 1-3. In such examples, a reset pin of the electronic fuse may be switched to a disabled state from an enabled state.

In some examples, the electronic fuse, for example, a power good output pin of the electronic fuse may not generate a power good signal, when the electronic fuse discontinues the transmission of the power from the one or more power supply devices to the one or more loads. However, the electronic fuse may generate the power good signal, when the electronic fuse continues the transmission of the power from the one or more power supply devices to the one or more loads. In some other examples, the electronic fuse may generate a low voltage power good signal, when the electronic fuse discontinues the transmission of the power from the one or more power supply devices to the one or more loads. However, the electronic fuse may generate a high voltage power good signal, when the electronic fuse continues the transmission of the power from the one or more power supply devices to the one or more loads. In some examples, the high voltage is about 5V and the low voltage is about 0V. The method 600 continues to block 606.

At block 606, the method 600 includes determining receipt of a trigger pulse from the buffer amplifier, and a non-receipt of a power good signal (or a low voltage power good signal) from the electronic fuse, by the buffer amplifier. In some examples, the pulse generator, upon addition of a new power supply device or a removal of a load, receives a signal. In some examples, the signal may be a power signal generated because of the addition of the new power supply device. In some other examples, the signal may be a load signal generated because of the removal of the load. In some examples, the power signal may be a combination of a new signal, which is generated because of the addition of the new power supply device, and power signals from the one or more pre-existing power supply devices in the modular server enclosure. Similarly, in some examples, the load signal may be combination of a new signal, which is generated because of removal of the load from the modular server enclosure, and load signals from the one or more pre-existing loads in the modular server enclosure. In some examples, the pulse generator circuit may generate the trigger pulse, when the new power supply devices is added to the modular server enclosure or when the load is removed from the modular server enclosure, as discussed in the examples of FIGS. 1-4. In such examples, the buffer amplifier may determine receipt of the trigger pulse from the pulse generator and non-receipt of the power good signal (or 0V power good signal) from the electronic fuse. Therefore at block 606, if the buffer amplifier determines receipt of trigger pulse and non-receipt of the power good signal (or receipt of 0V power good signal), i.e., "yes" at block 606, the method 600 continues to block 610, where the buffer amplifier generates a reset signal to the electronic fuse. Thus, at block 610, the buffer amplifier allows reset of the electronic fuse to allow the transmission of the power from the one or more power supply devices to the one or more loads. For example, the reset signal may reset a reset pin to switch from the disabled state to the enabled state so as to allow the power output pin to continue the transmission of the power from the power supply devices to the loads. The method 600 ends at block 610. However, at block 606, if the buffer amplifier determines receipt or non-receipt of the trigger pulse and receipt of power good signal (or receipt of 5V power good signal), i.e., "no" at block 606, the method 600 continues to block 612, where the buffer amplifier does not generate the reset signal to the electronic fuse. Thus, at block 612, the buffer amplifier does not allow reset of the electronic fuse so as to discontinue the transmission of the power from the one or more power supply devices to the one or more loads. For example, the reset pin may be maintained in the disabled state so as to allow the power output pin to discontinue the transmission of the power from the power supply devices to the loads. The method 600 ends at block 610.

Various features as illustrated in the examples described herein may be implemented in a power control system to automatically control a transmission of a power from one or more power supply devices to one or more loads. The power control system may latch-off an electronic fuse in an overcurrent event, thus allowing the one or more power supply devices to remain on even when excessive load is present in a computing system. Further, the power control system prevents a hot plug power supply device faults. The power control system may shun for the power supply design changes that may have required to handle the latching-off problem in the one or more power supply devices.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A power control system, comprising:
an electronic fuse connected between one or more power supply devices and one or more loads of a modular server enclosure;
a threshold control circuit connected to the electronic fuse and to the one or more power supply devices, wherein the threshold control circuit dynamically adjusts a threshold current for the electronic fuse based on a power supply capacity of the one or more power supply devices,
wherein the electronic fuse controls a transmission of a power from the one or more power supply devices to the one or more loads based on the threshold current and a load current drawn by the one or more loads; and
a pulse generator circuit connected to the one or more loads and to the one or more power supply devices,
wherein the pulse generator circuit comprises a first signal path and a second signal path connected to an OR-gate, wherein the first and second signal paths transmit a signal from at least one of the one or more power supply devices or the one or more loads to the OR-gate, and wherein the second signal path comprises an RC circuit for delaying transfer of the signal and generating a trigger pulse to the OR-gate upon at least one of addition of a new power supply device to the modular server enclosure or removal of at least one of the one or more loads from the modular server enclosure.

2. The power control system of claim 1, wherein the electronic fuse controls the transmission of the power by discontinuing the transmission of the power to the one or more loads if the threshold current is less than the load current.

3. The power control system of claim 1, wherein the electronic fuse controls the transmission of the power by continuing the transmission of the power to the one or more loads if the threshold current is greater than the load current.

4. The power control system of claim 1, wherein the electronic fuse comprises a power good output pin that generates a power good signal if the threshold current is greater than the load current.

5. The power control system of claim 4, further comprising a buffer amplifier connected to the pulse generator circuit to receive the trigger pulse, wherein the buffer amplifier is further connected to the electronic fuse to receive the power good signal, and wherein the buffer amplifier generates a reset signal to reset the electronic fuse to allow the transmission of the power from the one or more power supply devices to the one or more loads based on receipt of the trigger pulse from the pulse generator circuit and the power good signal from the power good output pin.

6. The power control system of claim 1, wherein the threshold control circuit comprises a control network and a controller, wherein the control network comprises a plurality of parallel circuit paths each comprising a resistor and a switch, and wherein the controller generates control signals based on a number of power supply devices connected to the modular server enclosure, to control operation of each switch for adjusting an effective resistance of the control network to enable determination of the power supply capacity of the one or more power supply devices and dynamic adjustment of the threshold current.

7. A modular server enclosure comprising:
one or more power supply devices;
one or more loads; and
a power control system comprising:
an electronic fuse connected between the one or more power supply devices and the one or more loads;
a threshold control circuit connected to the electronic fuse and to the one or more power supply devices,
wherein the threshold control circuit dynamically adjusts a threshold current for the electronic fuse based on a power supply capacity of the one or more power supply devices, and wherein the electronic fuse controls a transmission of a power from the one or more power supply devices to the one or more loads based on the threshold current and a load current drawn by the one or more loads; and
a pulse generator circuit connected to the one or more loads and to the one or more power supply devices,
wherein the pulse generator circuit comprises a first signal path and a second signal path connected to an OR-gate, wherein the first and second signal paths transmit a signal from at least one of the one or more power supply devices or the one or more loads to the OR-gate, and wherein the second signal path comprises an RC circuit for delaying transfer of the signal and generating a trigger pulse to the OR-gate upon at least one of addition of a new power supply device to the modular server enclosure or removal of at least one of the one or more loads from the modular server enclosure.

8. The modular server enclosure of claim 7, wherein the electronic fuse controls the transmission of the power by discontinuing the transmission of the power to the one or more loads if the threshold current is less than the load current.

9. The modular server enclosure of claim 7, wherein the electronic fuse controls the transmission of the power by continuing the transmission of the power to the one or more loads if the threshold current is greater than the load current.

10. The modular server enclosure of claim 7, wherein the electronic fuse comprises a power good output pin that generates a power good signal if the threshold current is greater than the load current.

11. The modular server enclosure of claim 10, further comprising a buffer amplifier connected to the pulse generator circuit to receive the trigger pulse, wherein the buffer amplifier is further connected to the electronic fuse to receive the power good signal, and wherein the buffer amplifier generates a reset signal to reset the electronic fuse to allow the transmission of the power from the one or more power supply devices to the one or more loads based on receipt of the trigger pulse from the pulse generator circuit and the power good signal from the power good output pin.

12. The modular server enclosure of claim 7, wherein the threshold control circuit comprises a control network and a controller, wherein the control network comprises a plurality of parallel circuit paths each comprising a resistor and a switch, and wherein the controller generates control signals based on a number of power supply devices connected to the modular server enclosure, to control operation of each switch for adjusting an effective resistance of the control network to enable determination of the power supply capacity of the one or more power supply devices and dynamic adjustment of the threshold current.

13. A method comprising:
dynamically adjusting a threshold current for an electronic fuse by a threshold control circuit, based on a power supply capacity of one or more power supply devices of a modular server enclosure,
wherein the electronic fuse of a power control system is connected between the one or more power supply devices and one or more loads of the modular server enclosure, and wherein the threshold control circuit of the power control system is connected to the electronic fuse and to the one or more power supply devices;
controlling a transmission of a power from the one or more power supply devices to the one or more loads based on the threshold current and a load current drawn by the one or more loads; and
generating a trigger pulse by a pulse generator circuit upon at least one of addition of a new power supply device to the modular server enclosure or removal of at least one of the one or more loads from the modular server enclosure,
wherein the pulse generator circuit is connected to the one or more loads and to the one or more power supply devices, wherein the pulse generator circuit comprises a first signal path and a second signal path connected to an OR-gate, wherein the first and second signal paths transmit a signal from at least one of the one or more power supply devices or the one or more loads to the OR-gate, and wherein the second signal path comprises an RC circuit for delaying transfer of the signal and generating the trigger pulse to the OR-gate.

14. The method of claim 13, wherein controlling the transmission of the power comprises discontinuing the transmission of the power to the one or more loads if the threshold current is less than the load current.

15. The method of claim 14, further comprising generating a reset signal by a buffer amplifier to reset the electronic fuse to allow the transmission of the power from the one or more power supply devices to the one or more loads based on receipt of the trigger pulse from the pulse generator circuit, and a power good signal from a power good output pin,
wherein the electronic fuse comprises the power good output pin that generates the power good signal if the threshold current is greater than the load current, and
wherein the buffer amplifier is connected to the pulse generator circuit to receive the trigger pulse and to the electronic fuse to receive the power good signal.

16. The method of claim 13, wherein controlling the transmission of the power comprises continuing the transmission of the power to the one or more loads if the threshold current is greater than the load current.

17. The method of claim 13, wherein the threshold control circuit comprises a control network and a controller, wherein the control network comprises a plurality of parallel circuit paths each comprising a resistor and a switch, and wherein the controller generates control signals based on a number of power supply devices connected to the modular server enclosure, to control operation of each switch for adjusting an effective resistance of the control network to enable determination of the power supply capacity of the one or more power supply devices and dynamic adjustment of the threshold current.

* * * * *